United States Patent [19]
Garza et al.

[11] Patent Number: 4,882,008
[45] Date of Patent: Nov. 21, 1989

[54] DRY DEVELOPMENT OF PHOTORESIST

[75] Inventors: Cesar M. Garza, Plano; Monte A. Douglas, Coppell; Lee M. Loewenstein, Plano; Cecil J. Davis, Greenville, all of Tex.

[73] Assignee: Texas Instruments Incorporated, Dallas, Tex.

[21] Appl. No.: 216,884

[22] Filed: Jul. 8, 1988

[51] Int. Cl.⁴ ............ B44C 1/22; H01L 21/306; C03C 15/00; B29C 37/00

[52] U.S. Cl. .................... 156/643; 156/646; 156/655; 156/657; 156/659.1; 156/628; 156/662; 156/668; 156/904; 427/43.1; 430/296; 430/313

[58] Field of Search ............ 156/643, 646, 655, 659.1, 156/662, 668, 628, 657, 904; 427/38, 39, 43.1; 430/296, 313

[56] References Cited

U.S. PATENT DOCUMENTS 4,751,170  6/1988  Mimura et al. ............... 156/643 X
4,782,008  11/1988  Babich et al. ............... 430/313

Primary Examiner—William A. Powell
Attorney, Agent, or Firm—B. Peter Barndt; James T. Comfort; Melvin Sharp

[57] ABSTRACT

A process for developing a photolithographic pattern on the surface of an exposed workpiece in a process chamber; disposing the workpiece in a process chamber; heating the workpiece and introducing a silylating agent to the process chamber and to a face of the workpiece to be processed; generating activated species from a source of oxygen; and introducing the activated species to the face of the workpiece.

29 Claims, 3 Drawing Sheets

DRY DEVELOPMENT OF PHOTORESIST

BACKGROUND OF THE INVENTION

1. Field of the Invention

The present invention relates to a method of manufacturing integrated circuits and other electronic devices. More particularly, the invention relats to an improved process for photoresist patterning in the manufacturing of integrated circuits and other electronic devices.

2. Description of the Related Art

The manufacture of integrated circutis requires an accurate and precise method to form patterns on wafers to delineate the areas for subsequent doping, isolation, and/or internal interconnection. The technology involved in the generation of these patterns is known as microlithography and it involves the following steps: (a) a mask or reticle is made with the required information, (b) a thin layer of a photosensitive polymer known as photoresist is coated onto the wafer, (c) the photoresist is exposed through the mask using the appropriate ultraviolet radiation, and (d) a relief image is formed using a suitable solvent called the developer.

The subsequent steps: etching, doping or deposition are carried out under vacuum. If as many as possible of the lithography steps could also be carried under vacuum, the level of particle contamination could be reduced. In the past the development of photoresist patterns in a dry environment has required the deposition of several film layers, such as: a top imaging layer, an intermediate layer to be used as a mask, and a bottom planarizing layer. This scheme, however, increases process complexity and is one of the main reasons why dry-development of photoresists has found no use in volume production of semiconductor devices. In addition of that, dry development of photoresists offers several advantages over conventional photoresist processing, among others less sensitivity to the rflectivity and topography of the underlying substrate.

Surface-sensitive processes,where only the surface of the resist needs to be exposed offer the performance advantages of multilayer schemes with the simplicity of single layer processing. The best known such processes is the so-called "DESIRE" process. This process consists in selectively incorporating silicon-containing species in the exposed areas of the photoresist from the gas phase using a silylating agent such as hexamethyldisilazane amine, HMDS. In an oxygen plasma, the regions that have incorporated silicon turn into silicon dioxide. This protects the underlying photoresist from the oxygen plasma whereas the unexposed regions are etched away in the plasma, with the end result that a relieve image is formed.

If the silylation, the dry-develop, the subsequent substrate etch and resist removal could be performed sequentially in the same chamber, in separate chambers with of the same piece of equipment, in separate chambers with vacuum wafer transfer, lower particle contamination could be achieved. This in turn would improve the yield,and increase throughput. Furthermore, in low volume production of application specific devices, higher equipment utilization can be achieved reducing initial capital requirements.

SUMMARY OF THE INVENTION

Described below is a process for developing a photolithographic pattern on the surface of an exposed workpiece in a process chamber comprising the steps of: disposing the workpiece in a process chamber; heating the workpiece and introducing a silylating agent to the process chamber and to a face of the workpiece to be processed; generating activated species from a source of oxygen; and introducing the activated species to the face of the workpiece. It can be performed where the activated species are generated in the process chamber or in a chamber remote from the process chamber.

The above described process can also be performed in two process chambers where the two are attached to a central transfer module for transferring the workpiece under a vacuum. It can also be performed in two separated chambers where the workpiece is transferred in a vacuum wafer carrier between them.

It has also been found useful to transfer and develop the wafer in a face down configuration and under a vacuum.

DESCRIPTION OF THE DRAWINGS

The present invention will be described with reference to accompanying drawings, wherein.

DESCRIPTION OF THE PREFERRED EMBODIMENTS

The present invention can be practiced using a processing module that is capable of generating a plasma and capable of heating a workpiece during processing. In addition, such a module may usefully have the capability to provide plasma products from a plasma generator remote from a process chamber. An example of a processing module that can be used to perform this process can be used in FIGS. 1 and 2. These process modules are like those disclosed in U.S. patent application Ser. No. 074,377, filed July 16, 1987 which is hereby incorporated by reference. The process can also be carried out in two modules similar module 100 and these modules can be either connected to central transfer chamber or can be totaly separated, the wafer 48 being transported in vacuum wafer carrier 10.

Figure 1:
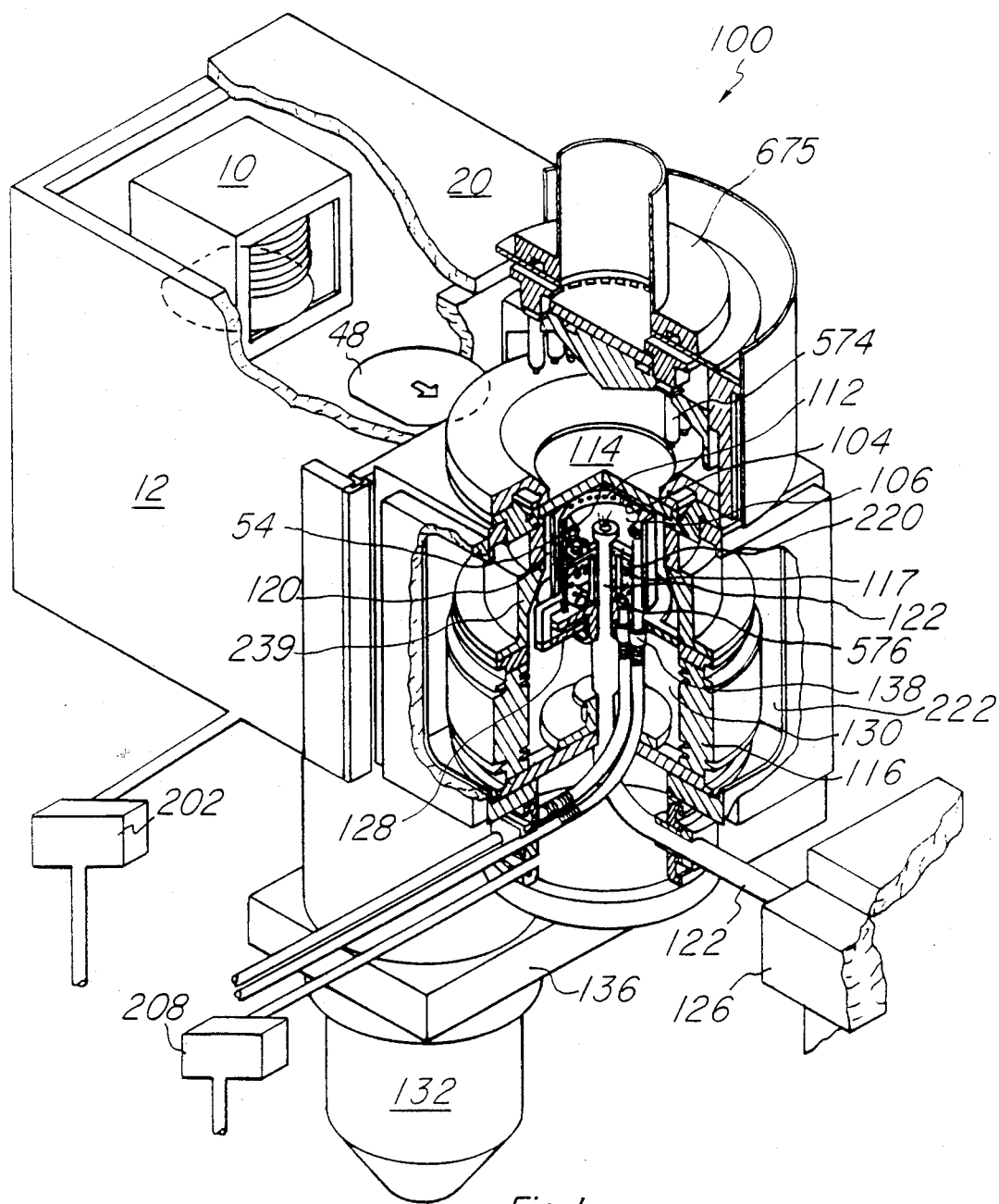
FIG. 1 shows a configuration for a process module which can be used to perform the present invention.

Referring now to FIG. 1, a process module 100 is shown. This process module has remote plasma, in situ plasma and radiant heat capabilities. A vacuum wafer carrier 10 and a transfer arm (not shown) and processing chamber 106 are utilized to transfer the wafer 48 from the vacuum wafer carrier 10 to the process module 100. Process module 100 is shown with a first process gas distributor 102 and a process gas distributing ring 104 both of which are located in the upper part of the process chamber 106. The process gas distributor ring 104 can supply a gas mixture to the process module. Process gas distributor ring 104 is arranged about the vertical axis of chamber 106. The gas exits from the process gas distributor ring 104 through a plurality of openings 112 in the bottom of the process gas distributor ring 104. The vertical walls of process chamber 106 can be made of quartz and form a cylinder about the vertical axis of process chamber 106. The bottom of process chamber 106, 117 can also be made from quartz.

Chamber 106 is opened and closed by bellows 116. The bellows 116 move the vertical walls of chamber 106 upward and into contact with substrate 114 or in adjacent portion of module 100. A seal (not shown) can be provided at the location where the vertical wall of chamber 106 comes into contact with substrate 114 or in adjacent portion of module 100. The bellows 116 moves the chamber 106 upward to close the chamber and downward to open the chamber. In the open position the transfer arm (not shown) can transfer the wafer 48 from the carrier 10 through load lock chamber 12 and into the process chamber 106 onto fingers or pins 120. When the chamber 106 is closed, the fingers 120 move upward to place the wafer 48 into contact with the substrat 114.

The remote plasma is supplied into the bottom of chamber 106 along the vertical axis through a pipe 122. Pipe 122 extends from a remote plasma generator 126 through chamber bottom 117. The pipe 122 has, for example, a slip fit or a bellows 128 to accommodate the vertical movement of chamber 106, including the chamber bottom 117. Gas distributor ring 104 fits into an open end 138 of pipe 144. Gas distributor ring 104 is arranged concentrically within process chamber 106 and can supply a second process gas to the process chamber 106. Below chamber bottom 117 is located a chamber 130 which is connected to pump 132 and valve 136. Thus, a generally downward flow through chambers 106 and 130 is provided. Pump 132 and valve 136 provide the desired vacuum within the chamber 106.

After the desired operation is finished, the gas supplied through pipe 122 and if desired 144 is cut off. The process chamber 106 and chamber 130 are pumped down to the same pressure as the load lock 12 ($10^{-3}$ Torr or less). A holding time may then be interposed, for thermal stabilization of the process module or for release of possible suspended particulate and then the process module 100 is opened in a transfer arm (not shown) removes the wafer from the process module 130 through chamber 12 replacing it in the vacuum wafer carrier 10. A particulate detector 208 connected to chamber 130 can be used to detect the presence or absence of particulate.

Process module 100 which includes only one module and one vacuum load lock, but it can also be used in embodiments where a central handling chamber is combined with plural process modules 100 and one or more vacuum load lock chambers 12.

Note that a particulate sensor 202 is explicitly shown connected to the interior of vacuum load lock chamber 12. This particulate sensor 202 may not be physically located very close to the docking position of vacuum wafer carrier 10 as long as the signal from particulate sensor 202 does provide an indication of the level of particulats present in the interior of the vacuum load lock chamber 12. The particulate sensor 202 is usually located downstream from the vacuum load lock chamber 12, in the pump out path (not shown). Particulate sensor 202 is, for example, a commercially available laser particle counter (which detects individual particles) combined with a counter which a provides an output signal showing the number of particles counted over a certain time duration.

Figure 2:
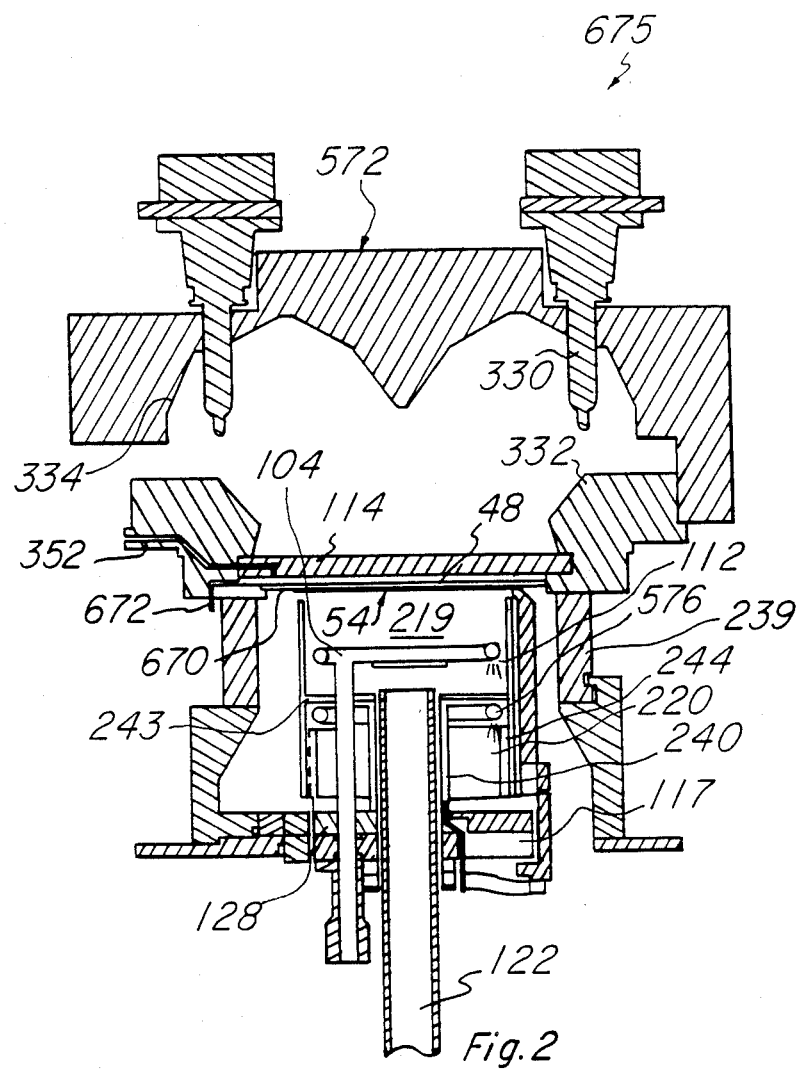
FIG. 2 shows a detailed configuration for the top portion of the process module of FIG. 1.

Module 100, as mentioned above, has in situ plasma and radiant heating capabilities in addition to the remote plasma capabilities indicated above. FIG. 2 details the top section 675 of module 100 and shows how the in situ and radiant heating capabilities can be implemented. The energy sources can be separately controlled either singly or in any combination.

As shown in FIG. 2, a wafer 48 is shown below a substrate 114 and a silicon electrode 670 which is located above and spaced a short distance away from the substrate 114. A purge gas lin 352 is provided to supply gas to the a space between a silicon electrode 670 and wall 238. It is, therefore, the silicon electrode 670 which will be radiantly heated and wafer 48 will be heated by thermal conduction.

A ring of heating elements, for example 18.1-kW high-temperature incandescent lamps 330, is mounted in an upper fixed reflector 334. The upper fixed reflector and a lower fixed reflector 332 help maximize the heating efficiency, i.e. improve the fraction of optical power emitted by the high-temperature incandescent lamps 330 which is optically coupled through the substrate 114 to silicon electrode 670.

Wafer 48, therefore, does not make direct contact with the substrate 114 at all. Instead, a silicon electrode 670, which is thinner than the substrat 114, contacts the wafer 48 when the wafer 48 is pushed against it by fingers 120. Since the silicon electrode 670 is substantially thinner than the substrate 114, conductive coupling to it exerts less thermal loading on the wafer 48 than full contact with the substrat 114 would. In the sample embodiment, the vacuum wall is 0.5 inches thick, and the silicon electrode is 0.06 inches thick. A purge gas line 352 permits a purge gas (e.g. Ar) to be supplied to the backside of the silicon electrode 670. It is also useful to have the silicon electrode 670 spaced away from the substrate 114.

The purge gas supply used in both this embodiment helps in achieving a uniform temperature distibution across the wafer. In addition, purge gas supply to areas near the transparent vacuum wall helps prevent deposition or etching effects from accummulating to degrade transparencyor generate particulates.

Silicon electrode 670 is connected around its edge to a RF conductor ring 672. The wafer 48, silicon electrode 670, and RF conductor ring 672 are all electrically coupled. Voltage for generating the in situ plasma close to the face 54 of wafer 48 can, therefore, be supplied to silicon electrode 670 through RF conductor ring 672.

These features allow process module 100 to perform processes for the syliation and dry development of photoresist which is described below. In addition, it can sequentially perform several different processes without moving the wafer. For example, it can provide dry in situ cleanup, high temperature native oxide removal, enhanced film deposition utilizing radiant hat. It is also capable of low temperature epitaxial film growth with a remot plasma source combined with radiant heat. Furthermore, it is capable of dry etch, including isotropic and anisotropic processes, by using in situ RF and remote plasma in combination. Pre-etch, etch, and post etch processes, direct react and/or rapid thermal processes can also be performed. These processes are described in detail hereinafter.

Figure 3A:
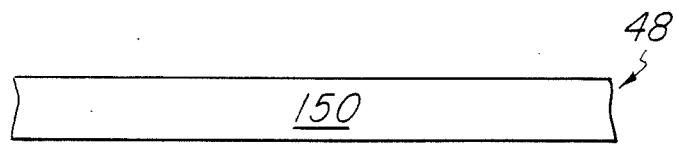
FIGS. 3(a–h) show a semiconductor wafer at an intermediate series of manufacturing steps.
Figure 3B:
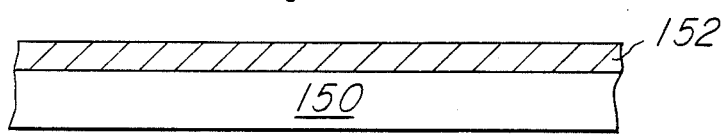
Figure 3C:
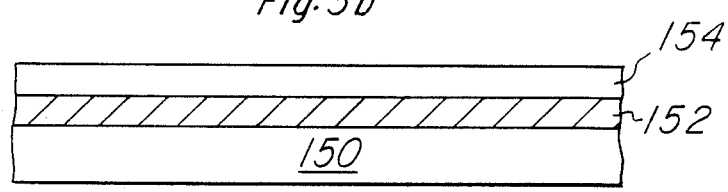
Figure 3D:
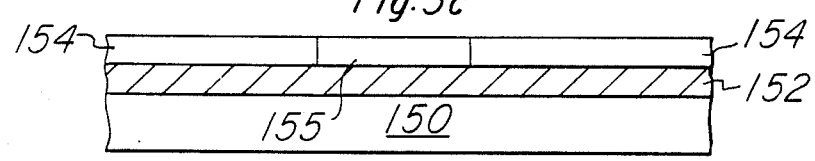
Figure 3E:
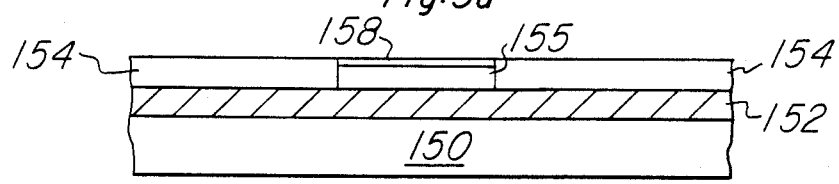

FIGS. 3(a)-(h) depict a wafer 48 at successive steps in a manufacturing process. FIG. 3 (a) shows wafer 48 as, for example, a crystalline silicon substrate 150. FIG. 3(b) shows a second layer 152 which is to be patterned. Layer 152 is atop, for example, crystalline silicon layer 150. In FIG. 3(c) a layer of photoresist has beendeposited atop layer 152. In fiure 3(d) an appropriate light source (not shown) is directed through a mask (not shown) thereby allowing only selected light rays 156 to pass to wafer 48 and strike the layer of photoresist 154.

Photoresist layer 154 has thus been exposed in those areas 155.

Figure 3F:
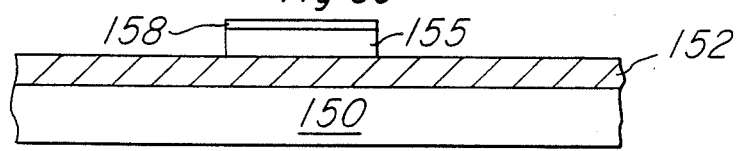
Figure 3G:
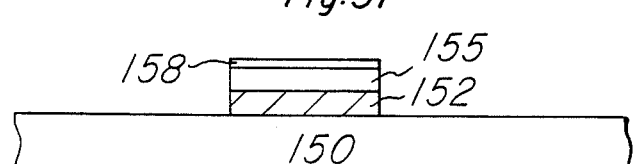
Figure 3H:
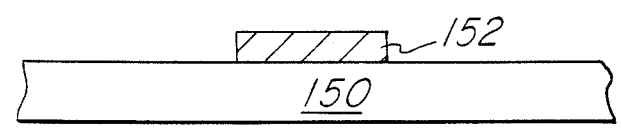

Wafer 48, which is carried in vacuum wafer carrier 10, is then placed in load lock chamber 12. Chamber 12 is then pumped to a vacuum and the door (not shown) to the vacuum wafer carrier 10 is then opened. A transfer arm (not shown) then removes wafer 48 from the vacuum wafer carrier 10 and moves it to process chamber 106. Wafer 48 is placed on fingers 120 by the transfer arm. The transfer arm is retracted from the process chamber 106 and wafer 48 is placed in contact with the substrate 114 or adjacent portion of module 100 as chamber 106 is closed by bellows 116 as described above. This places the wafer in proximity to the heated substrate 114. The power to the plurality of resistive heaters 118 is turned on to heat the wafer 48. The desired silylating agent can be supplied via pipe 144 to process gas distributor ring 104 and to the face of the wafer 48. As a result of exposing the photoresist to the vapors of the silylating agent, silicon is selectively incorporated into the resin in the exposed regions 158 whereupon exposure to activated species of oxygen which turns regions 158 into low grade silicon dioxide. This silicon dioxide acts as a mask protecting the underlying photoresist 155 from the oxygen plasma. The desired etchant gas, for example, an oxygen containing gas, such as nitrous oxide, can be passed through remote plasma generator 126 and is activated and the free radicals generated by it flow from the remote plasma generator 126 through pipe 122 into chamber 106 and to the face of wafer 48. Another method would pass the oxygen containing gas into the chamber through pipe 144 and distributor 104 while generating a plasma in the process chamber by applying an RF voltage to siliconelectrode 670. When the desired etch is complete, the power to the remote plasma generator 126 or the voltage to electrode 670 is turned off and the gas flow to pipe 122 or 144 is stopped. The results of this etch are shown in FIG. 3(f). Layer 152 can now be patterned as desired by etching away those portions not protected by the photoresist 155. This etch can be performed either in the same process module 100 or another process module. Layer 152 is patterned as shown in FIG. 3(g) resulting in structure shown in FIG. 3(h) after removal of the remaining photoresist. In addition, if desired, other manufacturing process steps can be performed in this same process module before removing the wafer.

When all of the desired processing within the module is complete, the bellows 116 moves downward thereby opening the process chamber as described above, thus allowing the transfer arm to enter the process chamber 106 and retrieve wafer 48 as described above. The transfer arm thn rturns the wafer 48 to the vacuum wafer carrier 10 in chamber 12 as described above.

The silylating agent discussed above, may be any suitable silylating agent such as hexamethyldisilizane (HMDS) or any other compound which has the general formula $R_nSiX_{4-n}$, (where X is a hydrolyzable group, e.g. alkoxy, acyloxy, amine or chlorine and R is an organic group, i.e., an organosilane).

Unless specifically stated otherwise, the power used in the in situ and microwave plasma can be widely varied, as can the other process parameters. The term low pressure as used here indicates a pressure which is less than ambient pressure.

Although silicon examples are shown herein, wafers made of other materials such as germanium, etc. can also be etched. The wafers can be comprised of many different configurations, for example, a single piece of crystals material or small crystals locate on a larger substrate. The plasma produced as disclosed herein will include free radicals. Although wafers such as 48 are disclosed herein, other types of flat workpieces could be used with the techniques disclosed herein.

The result of processing the wafer 48 can be electronic devices, for example, integrated circuits or discreet semiconductor devices. Once the processing is complete, the wafers are divided into devices. The circuits and devices are enclosed into packages, for example, as shown in U.S. Pat. Nos. 4,465,898 issued to Orcutt, et al., on Aug. 14, 1984 and 3,439,238 issued to Birchler, et al. on Apr. 15, 1969, which are incorporated hereinto by reference. These packages are then utilized in the construction of printed circuit boards. The printed circuit boards which cannot operate without the integrated circuits and devices to perform their intended functions, other required electrical components within computers, photocopiers, printers, telecommunication equipment, calculators and all of the other electronic equipment which are essential ingredients of the electronic and information age. Thus, electronic equipment can not function without these circuits and devices.

The present application describes features which serve to provide further advantages.

The present invention advantageously provides better control of the photolithographic development process.

It is yet another advantage of the present invention that it provides for photolithographic development in a low particulate environment thereby increasing the yield.

This invention allows the performance of several processing steps while maintaining a wafer under a vacuum and in a face down configuration in the same or another similar chamber.

Having described the invention in connection with certain specific embodiments thereof, it is to be understood that further modifications may now suggest themselves to those skilled in the art, but is intended to cover all such modifications as fall within the scope of the appended claims.

What is claimed is:

1. A process for developing a photolithographic pattern on the surface of a workpiece in a process chamber;
    (a) disposing the workpiece in a process chamber;
    (b) heating the workpiece and introducing a silylating agent to the process chamber and to a face of the workpiece to be processed;
    (c) generating activated species froma source of oxygen; and
    (d) introducing the activated species to the face of the workpiece.

2. The process of claim 1 wherein the silylating agent is hexamethyldisilizane.

3. The process of claim 1 wherein the silylating agent is organosilane.

4. The process of claim 1 wherein the silylating agent is a silane.

5. The process of claim 1 wherein the source of oxygen is nitrous oxide.

6. The process of claim 1 wherein carried out at a pressure less than ambient.

7. The process of claim 1 wherein the face to be processed faces downward.

8. The process of claim 1 wherein the workpiece is a wafer.

9. The process of claim 8 wherein the wafer is silicon.

10. The process of claim 1 wherein the workpiece is heated continuously.

11. The process of claim 1 wherein the activated species are generated in the process chamber.

12. The process of claim 1 wherein the activated species are generated in a chamber remote from the process chamber.

13. A process for developing a photolithographic pattern on the surface of a workpiece in a process chamber;
   (a) disposing the workpiece in a process chamber;
   (b) heating the workpiece and introducing a silylating agent to the process chamber and to a face of the workpiece to be processed;
   (c) generating activated species from a source of oxygen;
   (d) introducing the activated species to the face of the workpiece; and
   (e) performing additional process steps in the process chamber.

14. The process of claim 13 wherein the silylating agent is hexamethyldisilizane.

15. The process of claim 13 wherein the silylating agent is an organosilane.

16. The process of claim 13 wherein the source of oxygen is nitrous oxide.

17. The process of claim 13 wherein the source of oxygen is nitrous oxide.

18. The process of claim 13 wherein carried out at a pressure less than ambient.

19. The process of claim 13 wherein the face to be processed faces downward.

20. The process of claim 13 wherein the workpiece is a wafer.

21. The process of claim 20 wherein the wafer is silicon.

22. The process of claim 13 wherein the workpiece is heated continuously

23. The process of claim 13 wherein the activated species are generated in the process chamber.

24. The process of claim 13 wherein the activated species are generated in a chamber remote from the process chamber.

25. A process for developing a photolithographic pattern on the surface of a workpiece;
   (a) disposing said workpiece into a first process chamber;
   (b) heating said workpiece introducing a silylating agent to the first process chamber and to the surface of said workpiece;
   (c) transporting said wafer from said first process chamber to a second process chamber under vacuum;
   (d) generating activated species from a source of oxygen; and
   (e) introducing the activated species to the surface of the workpiece.

26. The process of 25 wherein the transporting step is performed using a vacuum wafer carrier.

27. The process of claim 25 wherein the transporting step is performed by moving the wafer from said first to said second process chamber using a central handling module connected to said first and second process chambers and maintained at a vacuum.

28. The process of claim 25 wherein the activated species are generated in the process chamber.

29. The process of claim 25 wherein the activated species are generated in a chamber remote from the process chamber.

* * * * *